(12) United States Patent
Hong

(10) Patent No.: US 11,699,588 B2
(45) Date of Patent: Jul. 11, 2023

(54) VERTICAL NANOWIRE SEMICONDUCTOR DEVICE AND MANUFACTURING METHOD THEREFOR

(71) Applicant: Ying Hong, Liaoning (CN)

(72) Inventor: Ying Hong, Liaoning (CN)

(73) Assignee: Ying Hong, Liaoning (CN)

( * ) Notice: Subject to any disclaimer, the term of this patent is extended or adjusted under 35 U.S.C. 154(b) by 0 days.

(21) Appl. No.: 17/695,336

(22) Filed: Mar. 15, 2022

(65) Prior Publication Data

US 2022/0208548 A1 Jun. 30, 2022

Related U.S. Application Data

(60) Division of application No. 17/028,342, filed on Sep. 22, 2020, now Pat. No. 11,342,183, which is a
(Continued)

(30) Foreign Application Priority Data

Mar. 23, 2018 (KR) .................. 10-2018-0034098
Nov. 22, 2018 (KR) .................. 10-2018-0145648

(51) Int. Cl.

| | |
|---|---|
| *H01L 21/02* | (2006.01) |
| *H01L 27/12* | (2006.01) |
| *H01L 29/04* | (2006.01) |
| *H01L 29/06* | (2006.01) |
| *H01L 29/423* | (2006.01) |

(Continued)

(52) U.S. Cl.
CPC .. *H01L 21/02672* (2013.01); *H01L 21/02502* (2013.01); *H01L 27/1222* (2013.01); *H01L 27/1277* (2013.01); *H01L 29/045* (2013.01); *H01L 29/0673* (2013.01); *H01L 29/42392* (2013.01); *H01L 29/66757* (2013.01); *H01L 29/66772* (2013.01); *H01L 29/78642* (2013.01); *H01L 21/02488* (2013.01); *H01L 21/02491* (2013.01); *H01L 21/02532* (2013.01); *H01L 21/02595* (2013.01); *H01L 29/0676* (2013.01)

(58) Field of Classification Search
None
See application file for complete search history.

(56) References Cited

U.S. PATENT DOCUMENTS

| | | | | |
|---|---|---|---|---|
| 6,475,840 B1 * | 11/2002 | Miyanaga | ......... | H01L 21/02672 257/E21.414 |
| 2015/0137067 A1 * | 5/2015 | Colinge | .............. | H01L 29/0676 438/268 |
| 2019/0097010 A1 * | 3/2019 | Wang | ................ | H01L 29/78642 |

* cited by examiner

*Primary Examiner* — Alexander G Ghyka
(74) *Attorney, Agent, or Firm* — Guntin & Gust, PLC; Miyoung Shin

(57) ABSTRACT

A vertical nanowire semiconductor device manufactured by a method of manufacturing a vertical nanowire semiconductor device is provided. The vertical nanowire semiconductor device includes a substrate, a first conductive layer in a source or drain area formed above the substrate, a semiconductor nanowire of a channel area vertically upright with respect to the substrate on the first conductive layer, wherein a crystal structure thereof is grown in <111> orientation, a second conductive layer of a drain or source area provided on the top of the semiconductor nanowire, a metal layer on the second conductive layer, a $NiSi_2$ contact layer between the second conductive layer and the metal layer, a gate surrounding the channel area of the vertical nanowire, and a gate insulating layer located between the channel area and the gate.

6 Claims, 13 Drawing Sheets

Related U.S. Application Data continuation of application No. PCT/KR2019/002515, filed on Mar. 5, 2019.

(51) Int. Cl.
*H01L 29/66* (2006.01)
*H01L 29/786* (2006.01)

VERTICAL NANOWIRE SEMICONDUCTOR DEVICE AND MANUFACTURING METHOD THEREFOR

CROSS-REFERENCE OF RELATED APPLICATIONS

The present application is a divisional of U.S. application Ser. No. 17/028,342 which is a continuation of PCT/KR2019/002515 filed on Mar. 5, 2019, which claims the benefit of the filing dates of Korean Patent Application Nos. 10-2018-0034098 filed Mar. 23, 2018 and 10-2018-0145648 filed Nov. 22, 2018, in the Korean Intellectual Property Office, the disclosures of which are incorporated herein in their entirety by reference.

TECHNICAL FIELD

The present disclosure relates to an Si nanowire semiconductor device and a manufacturing method therefor, and more particularly, to a semiconductor device using a vertical semiconductor nanowire and a manufacturing method therefor.

BACKGROUND

A high-performance semiconductor improves quality of an electronic product and comes with cost benefits. A semiconductor device needs to have high mobility and high reliability, in particular, needs to reduce characteristic dispersion by having certain characteristics.

AM-OLED displays have been mainly applied as mobile displays of recent smartphones. As a pixel switching element of such an AM-OLED display, a low temperature polycrystalline silicon thin film transistor (LTPS TFT) having high charge mobility and high reliability is appropriate even under high integration.

Excimer laser annealing is mainly used for crystallization of silicon to manufacture the low temperature polycrystalline silicon thin film transistor (LTPS TFT). When such an LTPS TFT is applied to a large area display, crystal grain uniformity of a certain level may not be maintained, and yield is low.

SUMMARY

Provided is a method of forming a <111>-oriented high-quality Si nanowire by using an MIC technology.

Provided are also a semiconductor device using an Si nanowire and a manufacturing method therefor.

According to an aspect of the present disclosure, a vertical nanowire semiconductor device manufactured by a method of manufacturing a vertical nanowire semiconductor device is provided. The method includes steps of (i) forming a seed layer of catalyst material containing Ni on a substrate, (ii) forming, on the seed layer, a multilayer in which a first conductive layer, a semiconductor layer, a second conductive layer, and a metal layer are sequentially stacked, (iii) forming a vertical nanowire including the first conductive layer, the semiconductor layer, the second conductive layer, and the metal layer above the substrate by patterning the multilayer, (iv) performing metal induced crystallization (MIC) through low temperature heat treatment and producing reactant of the seed layer for crystallization, activation, and formation of a contact layer. Crystal growth started in the first conductive layer in contact with the seed layer reaches the second conductive layer in the crystallization. The activation of the first conductive layer and the second conductive layer is induced by the crystallization. The method further includes steps of (iv) forming the contact layer between the second conductive layer and the metal layer while the reactant reaches the second conductive layer, (v) forming an insulating layer covering the vertical nanowire, (vi) forming a gate surrounding a channel area by the semiconductor layer of the vertical nanowire, and (vii) forming a metal pad electrically connected to the gate, the first conductive layer, and the second conductive layer. The vertical nanowire semiconductor device includes a substrate, a first conductive layer in a source or drain area formed above the substrate, a semiconductor nanowire of a channel area vertically upright with respect to the substrate on the first conductive layer, wherein a crystal structure thereof is grown in <111> orientation, a second conductive layer of a drain or source area provided on the top of the semiconductor nanowire, a metal layer on the second conductive layer, a $NiSi_2$ contact layer between the second conductive layer and the metal layer, a gate surrounding the channel area of the vertical nanowire, and a gate insulating layer located between the channel area and the gate.

In at least one variant, the first conductive layer, the second conductive layer, and the semiconductor nanowire include one of Si, SiGe, and Ge.

In another variant, the semiconductor nanowire includes a first nanowire for a PMOS semiconductor device and a second nanowire for an NMOS semiconductor device.

In further another variant, the semiconductor nanowire includes a first nanowire for a PMOS semiconductor device and a second nanowire for an NMOS semiconductor device.

In another variant, each of the PMOS semiconductor device and the NMOS semiconductor device has a multi-channel structure having a plurality of nanowires.

In another variant, each of the PMOS semiconductor device and the NMOS semiconductor device has a multi-channel structure having a plurality of nanowires.

According to an aspect of the present disclosure, a method of manufacturing a semiconductor device, includes steps of: (i) forming a seed layer on a substrate, (ii) forming, on the seed layer, a multilayer in which a first conductive layer, a semiconductor layer, a second conductive layer are sequentially stacked; (iii) forming a vertical nanowire above the substrate by patterning the multilayer; (iv) crystallizing the vertical nanowire by heat treatment; (v) forming an insulating layer covering the vertical nanowire; (vi) forming a gate surrounding a channel area by the semiconductor layer of the vertical nanowire; and (vii) forming a metal pad electrically connected to the gate, the first conductive layer, and the second conductive layer.

The method may further include: forming, above the substrate, an inter-layer dielectric (ILD) layer covering the vertical nanowire and having a plurality of contact holes corresponding to the first conductive layer, the second conductive layer, and the gate; and forming, on the ILD layer, a plurality of metal pads respectively corresponding to the gate, the first conductive layer, and the second conductive layer.

The seed layer may be formed of at least one selected from the group consisting of $NiO_x$, $NiC_xO_y$, $NiN_xO_y$, $NiC_xN_yO_z$, $NiC_xO_y{:}H$, $NiN_xO_y{:}H$, $NiC_xN_yO_z{:}H$, $Ni_xSi_y$, and $Ni_xGe_y$.

The first conductive layer, the second conductive layer, and the vertical nanowire may include one of Si, SiGe, and Ge.

The first conductive layer and the second conductive layer may be silicon conductive layers, and the semiconductor layer may be a silicon layer.

The multilayer may include a first multilayer having a p-type semiconductor layer and an n-type conductive layer, and a second multilayer having an n-type semiconductor layer and a p-type conductive layer.

A first vertical nanowire and a second vertical nanowire may be formed by simultaneously patterning the first multilayer and the second multilayer According to another aspect of the present disclosure, a semiconductor device, manufactured by the method, includes: (i) a substrate; (ii) a first conductive layer in a source or drain area formed above the substrate; (iii) a semiconductor nanowire of a channel area vertically upright with respect to the substrate on the first conductive layer; (iv) a second conductive layer of a drain or source area provided on the top of the semiconductor nanowire; (v) a gate surrounding the channel area of the vertical nanowire; and (vi) a gate insulating layer located between the channel area and the gate.

The first conductive layer, the second conductive layer, and the vertical nanowire may include one of Si, SiGe, and Ge.

The first conductive layer and the second conductive layer may be silicon conductive layers, and the semiconductor nanowire may be a single crystal grain silicon nanowire.

A metal layer may be formed on the second conductive layer, and an $NiSi_2$ contact layer may be provided between the second conductive layer and the metal layer.

An ILD layer, covering the vertical nanowire and having a plurality of contact holes corresponding to the first conductive layer, the second conductive layer, and the gate, may be formed above the substrate, and a plurality of metal pads respectively corresponding to the gate, the first conductive layer, and the second conductive layer may be formed on the ILD layer.

The vertical nanowire may have a circular or polygonal cross section.

The first conductive layer and the second conductive layer may extend from a lower portion of the semiconductor nanowire to a portion directly under each contact hole.

Crystals of the semiconductor nanowire and the first and second conductive layers may be oriented in <111> direction.

According to an example embodiment provides a method of manufacturing a semiconductor nanowire channel in which crystals are grown in <111> orientation and a method of manufacturing a CMOS by applying the same. According to the example embodiment may implement a system on panel (SOP) by manufacturing a high-performance LSI, memory, a sensor, and the like on a large area substrate According to the example embodiment described above, an ion implantation process for forming a conductive layer is not separately needed, and an existing activation process is not also needed. Therefore, according to the example embodiment, a high-yield semiconductor device having high mobility, high reliability, and low product-to-product characteristic dispersion may be obtained.

DETAILED DESCRIPTION

Figure 1:
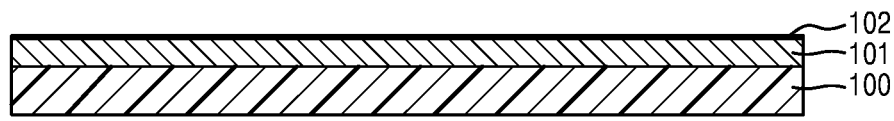
FIG. 1 shows a process for forming a buffer layer and a seed layer on a substrate during manufacturing a vertical nanowire semiconductor device, according to an example embodiment.

Hereinafter, example embodiments of the present disclosure will be described in detail with reference to the accompanying drawings. However, embodiments of the present disclosure may be modified into various forms, and the scope of the present disclosure should not be construed as being limited by the embodiments described below. The embodiments of the present disclosure may be interpreted as being provided to further completely explain the spirit of the present disclosure to one of ordinary skill in the art. Like reference numerals in the drawings denote like elements. Various elements and areas in the drawings are schematically drawn. Therefore, the spirit of the present disclosure is not limited by the relative size or spacing drawn in the accompanying drawings. Although the terms first, second etc. may be used herein to describe various elements, these elements should not be limited by these terms. These terms are only used to distinguish one element from another element. For example, a first element may be termed a second element and conversely, the second element may be termed the first element without departing from the scope of the present disclosure.

The terminology used herein is for the purpose of describing particular embodiments only and is not intended to be limiting of example embodiments. As used herein, the singular forms are intended to include the plural forms as well, unless the context clearly indicates otherwise. It will be further understood that the terms "comprises" and/or "have" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meanings as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two processes described in succession may be performed substantially simultaneously or may be performed in an order opposite to the described order.

As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. As used herein, the term "and/or" includes any and all combinations of one or more of the associated listed items. The term "substrate" as used herein may mean a substrate itself or a stack structure including a substrate and a predetermined layer or film formed on the surface thereof. As used herein, "the surface of the substrate" may mean an exposed surface of the substrate itself, or an outer surface of a predetermined layer or film formed on the substrate. What is described as "above" or "on" may include not only those directly on in contact but also non-contact above.

Hereinafter, a method of manufacturing a COS device including a vertical nanowire transistor according to an example embodiment will be described with reference to the accompanying drawings.

A nanowire transistor according to an example embodiment includes: a substrate; a first conductive layer in a source or drain area formed above the substrate; a semiconductor nanowire in a channel area vertically upright on the first conductive layer; a second conductive layer in a drain or source area provided on the top of the nanowire; a gate surrounding the vertical nanowire; and a gate insulating layer located between the channel area and the gate.

A method of manufacturing a nanowire transistor according to an example embodiment, includes: forming a seed layer on a substrate; forming, on the seed layer, a multilayer in which a first conductive layer, a semiconductor silicon layer, and a second conductive layer are sequentially stacked; forming a nanowire above the substrate by patterning the multilayer; crystallizing the nanowire by heat treatment; forming an insulating layer covering the first conductive layer; forming a gate surrounding a channel area by a semiconductor layer of the nanowire; and forming a metal pad electrically connected to the second conductive layer.

Hereinafter, a method of manufacturing a CMOS according to an example embodiment as described above will be described. Through understanding of the following technical content, a structure of a vertical silicon nanowire transistor and a method of manufacturing the same may be easily derived. In the following embodiments, a method of manufacturing a CMOS device by using amorphous silicon as a semiconductor material will be described as an example.

A shown in FIG. 1, a buffer layer 101 and a seed layer 102 are sequentially formed on a substrate 100.

The buffer layer 101 may be provided by a top-most dielectric layer of a stack structure already formed through a preceding process. The buffer layer 101 may be formed of, for example, an insulating material such as $SiO_2$, SiNx, SiONx, or AlOx.

The seed layer 102 on the buffer layer 101 may include, as Ni-based oxide, at least one selected from the group consisting of NiOx, NiCxOy, NiNxOy, NiCxNyOz, NiCxOy:H, NiNxOy:H, NiCxNyOz:H, NixSiy, and NixGey.

Figure 2:
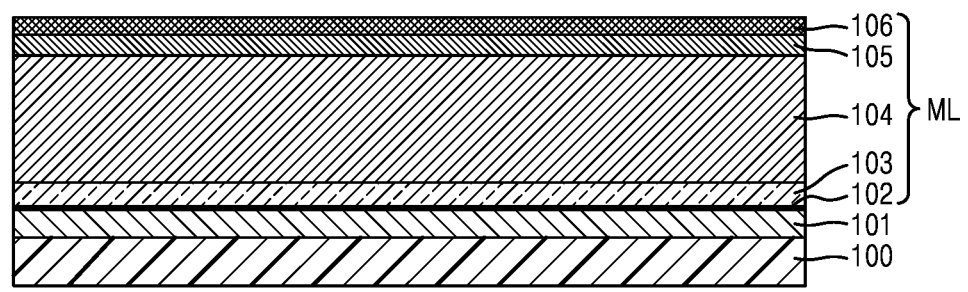
FIG. 2 shows a process for forming a first multilayer for a first transistor on the buffer layer during manufacturing a vertical nanowire semiconductor device, according to an example embodiment.

As shown in FIG. 2, a multilayer ML, including a first silicon conductive layer 102, a silicon semiconductor layer 104, a second silicon conductive layer 105, and a metal layer 106 on the second silicon conductive layer 105 that are in an amorphous state, is formed on the seed layer 102. For example, the multilayer ML may have a stack structure of n+ a-Si/p a-Si/n+ a-Si/TiN for obtaining a PMOS transistor having a p-type silicon channel and n-type silicon conductive layers on and underneath the p-type silicon channel.

Figure 3:
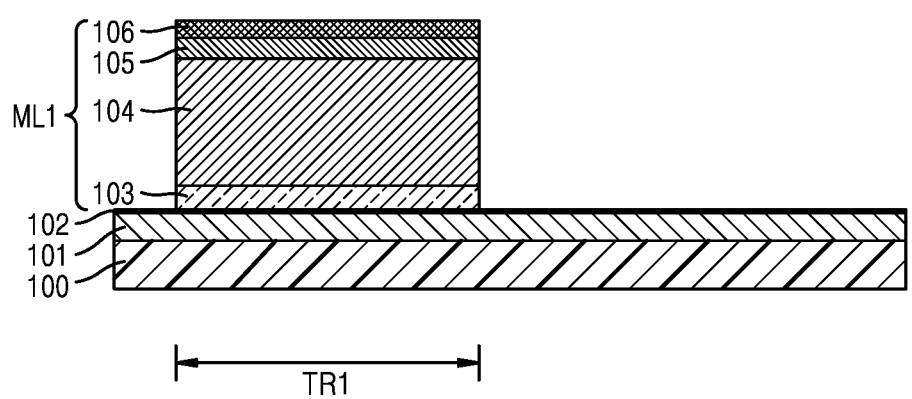
FIG. 3 shows a process for patterning the multilayer on the substrate during manufacturing a vertical nanowire semiconductor device, according to an example embodiment.

As shown in FIG. 3, the multilayer ML is patterned by applying a photoresist (PR) mask to an area of a first transistor, for example, an area of a first transistor TR1 defined as a PMOS transistor area above the substrate. The patterning of the multilayer ML may be performed by an existing photography method. Due to the patterning of the multilayer ML, a first multilayer ML1 remains merely in the area of the first transistor TR1, and the seed layer 102 on the substrate 100 is exposed in a remaining portion.

Figure 4:
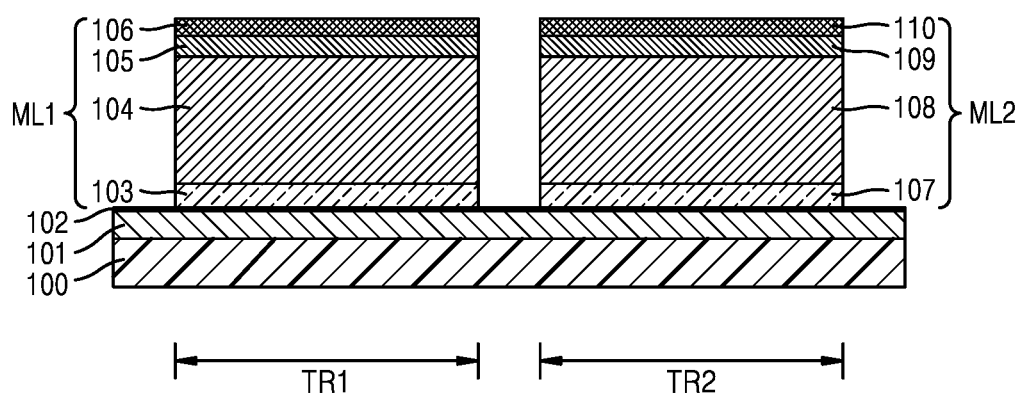
FIG. 4 shows a process for forming a second multilayer for a second transistor on the substrate during manufacturing a vertical nanowire semiconductor device, according to an example embodiment.

As shown in FIG. 4, a second multilayer ML2 for forming a second transistor, for example, an NMOS transistor in a portion defined as an area of a second transistor TR2 is formed above the substrate 100. The second multilayer ML2 may have a stack structure of p+ a-Si/n a-Si/p+ a-Si/TiN. The second multilayer ML2 may be obtained through a process similar to a process of forming the first multilayer ML1 and may have a structure in which a first silicon conductive layer 107, a silicon semiconductor layer 108, a second silicon conductive layer 109, and a metal layer 110 are stacked from the bottom.

Figure 5:
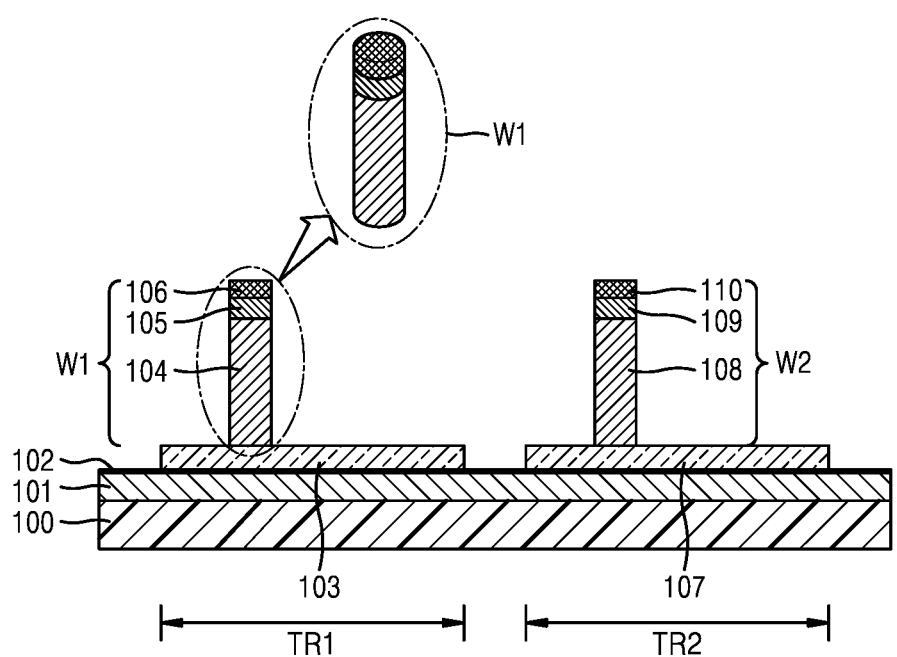
FIG. 5 shows a process for forming a first silicon nanowire and a second silicon by patterning the first and second multilayer during manufacturing a vertical nanowire semiconductor device, according to an example embodiment.

As shown in FIG. 5, the first multilayer ML1 and the second multilayer ML2 are simultaneously patterned to form a first silicon nanowire W1 and a second silicon nanowire W2 for vertical first transistor and second transistor on the first and second silicon conductive layers 103 and 107 Here, the patterning is performed down to both of the silicon semiconductor layers 104 and 108 in the areas of the first and second transistors TR1 and TR2, and both of the first silicon conductive layers 103 and 107 underneath the same are excluded from patterning. Therefore, the first silicon conductive layers 103 and 107 extend to the outside of the first and second silicon nanowires W1 and W2 and extend directly under a corresponding contact hole of an ILD layer to be described later.

The first and second silicon nanowires W1 and W2 may have cylindrical shapes and, according to another embodiment, may have rectangular pillar shapes or polygonal pillar shapes. A particular structure or shape of such a silicon nanowire does not limit the technical scope of various example embodiments.

Figure 6:
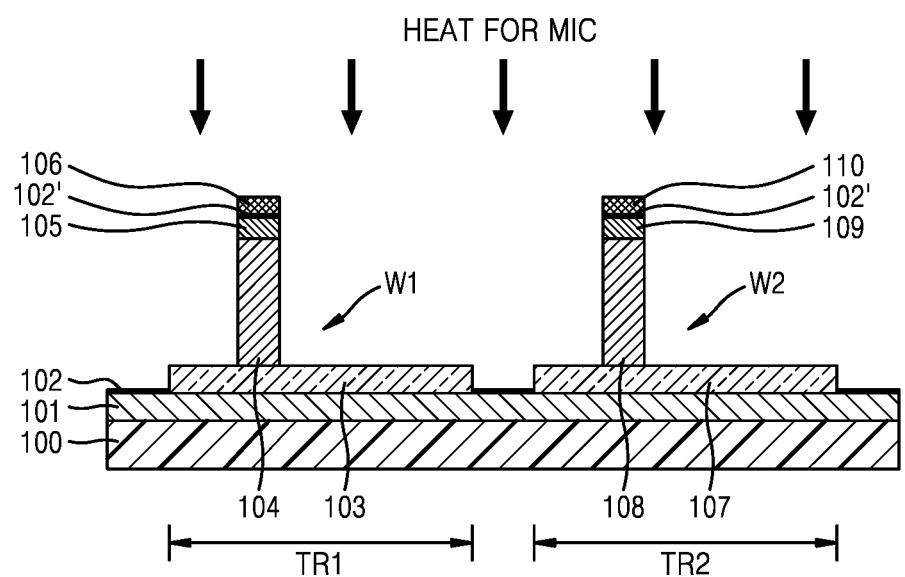
FIG. 6 shows a process for crystallizing the first and second nanowire by heat treatment during manufacturing a vertical nanowire semiconductor device, according to an example embodiment.

As shown in FIG. 6, the first and second silicon nanowires W1 and W2 are crystallized by performing metal induced crystallization (MIC) through low temperature heat treatment. In this crystallization process, Ni of a seed layer reacts with Si to produce $NiSi_2$, and $NiSi_2$ reaches the first and second silicon conductive layers 105 and 109 that are the topmost portions of the first and second silicon nanowires W1 and W2 to form an $NiSi_2$ contact layers 102', 102' between the second silicon conductive layers 105, 109 and the metal layers 106, 110.

A crystallized nanowire has crystal orientation in (111) direction. After such heat treatment, $NiSi_2$ that may remain on the outer circumferential surface of a single crystal grain silicon nanowire may be removed by wet cleaning using $HNO_3$, HF, or the like.

Figure 7:
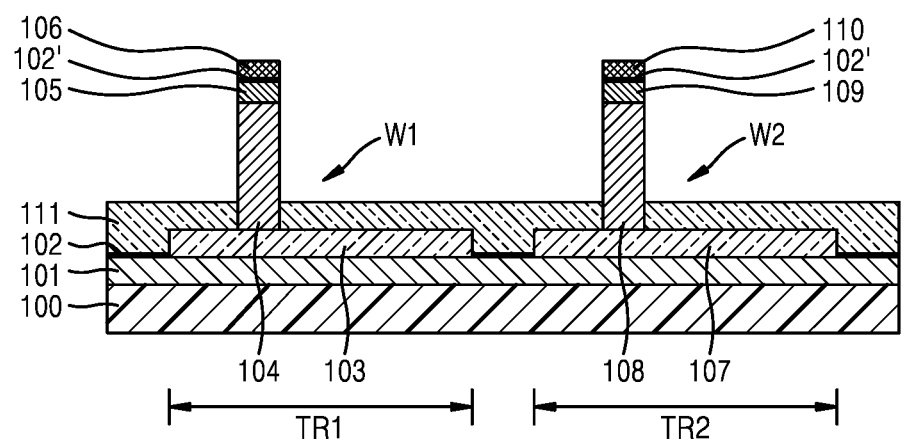
FIG. 7 shows a process for forming a first insulating layer over the substrate during manufacturing a vertical nanowire semiconductor device, according to an example embodiment.

As shown in FIG. 7, a first insulating layer 111 is formed to a preset thickness on the first silicon conductive layers 103 and 107 above the substrate 100. The first insulating layer 111 may be manufactured by a method of forming and etching back an organic insulator such as polyimide (PI) or a high-density plasma (HDP) oxide layer. Here, the first insulating layer 111 covers merely lower portions of the first and second silicon nanowires W1 and W2, and a thickness thereof is set according to a location of a lower boundary of a gate to be formed in a subsequent process.

Figure 8:
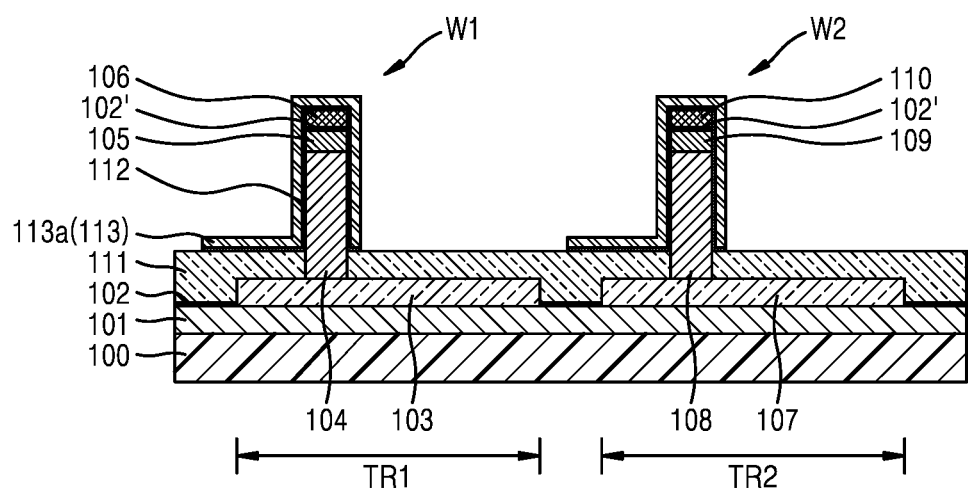
FIG. 8 shows a process for forming a gate insulating layer and a gate are on sides of the first and second silicon nanowires during manufacturing a vertical nanowire semiconductor device, according to an example embodiment.

As shown in FIG. 8, a gate insulating layer 112 and a gate 113 are formed on sides of the first and second silicon nanowires W1 and W2. This process involves deposition and patterning processes of an insulating material and a gate material. Here, the gate insulating layer 112 may be formed of $SiO_2$, and the gate 113 may be formed of MoW. In this case, the gate insulating layer 112 and the gate 113 are in an incomplete state and also cover upper portions of the first and second silicon nanowires W1 and W2 as well. Also, a pad 113a as a terminal for external connection of the gate 113 is provided underneath the gate 113 and extends a preset length in a direction parallel with the plane of the substrate 100.

Figure 9:
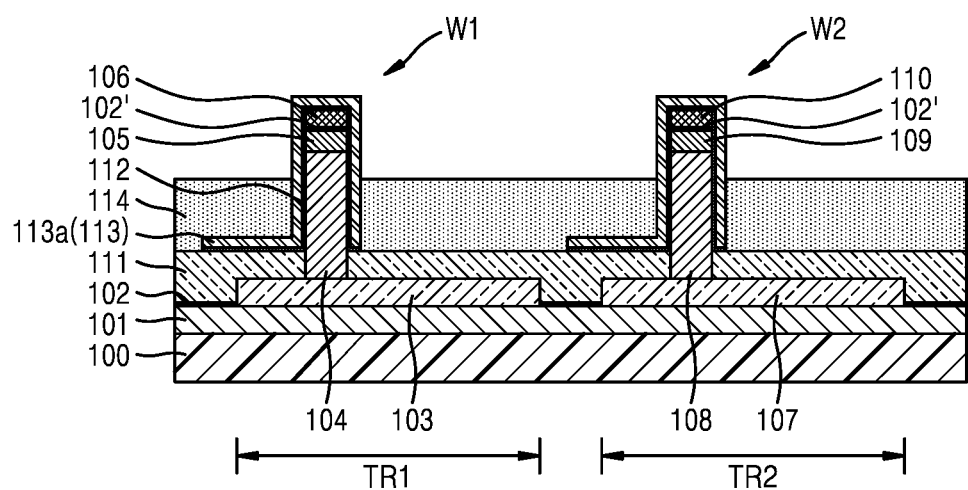
FIG. 9 shows a process for forming a second insulating layer formed above the substrate during manufacturing a vertical nanowire semiconductor device, according to an example embodiment.

As shown in FIG. 9, a second insulating layer 114 is formed as a planarization layer to a preset thickness above the substrate 100. The top surface of the second insulating layer 114 is located under the contact layers 102' of the first and second silicon nanowires W1 and W2. The second insulating layer 114 is used as a mask for removing unneeded portions of the gate insulating layer 112 and the gate 113 remaining at the upper portions of the first and second silicon nanowires W1 and W2. The second insulating layer 114 having the adjusted height or thickness as described above may be manufactured by forming and etching back an organic insulator such as polyimide (PI) or an HDP oxide layer.

Figure 10:
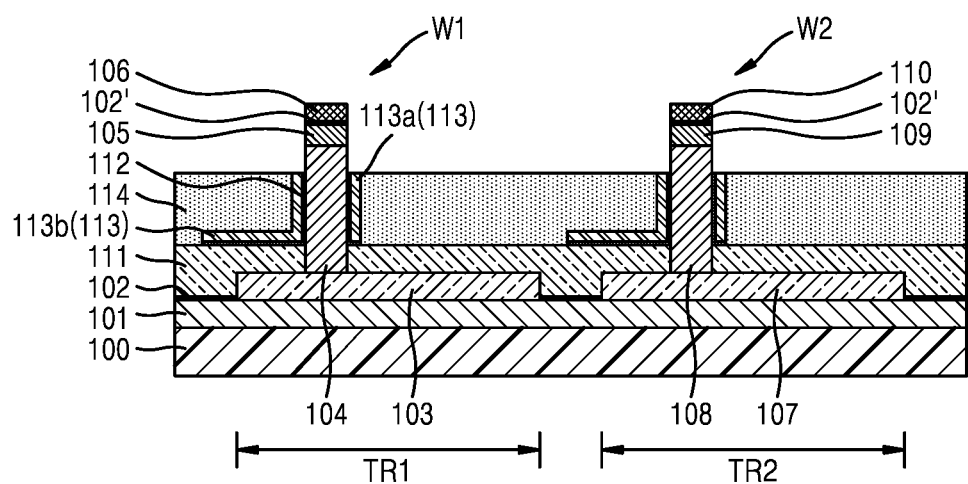
FIG. 10 shows a process for removing exposed portions of the gate and the gate insulating layer during manufacturing a vertical nanowire semiconductor device, according to an example embodiment.

As shown in FIG. 10, exposed portions of the gate 113 and the gate insulating layer 112 that are not covered with the second insulating layer 114 are removed by isotropic etch, thereby completely exposing both of the second silicon conductive layers 105 and 109, and both of the contact layers 102', 102' underneath the same, which are the upper portions of the first and second nanowires W1 and W2. In this process, the gate 113 that is incomplete is completed.

Figure 11:
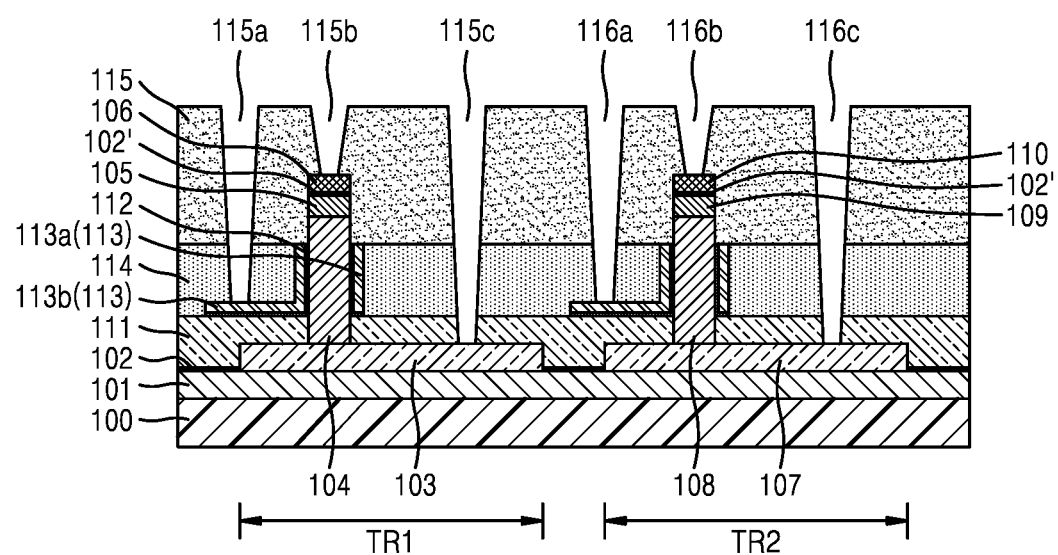
FIG. 11 shows a process for forming an ILD layer having a plurality of contact holes above the substrate during manufacturing a vertical nanowire semiconductor device, according to an example embodiment.

As shown in FIG. 11, ILD layer 115 having a plurality of contact holes 115a, 115b, 115c, 116a, 116b, and 116c is formed above the substrate 100. The ILD layer 115 covers a CMOS semiconductor device including the first transistor TR1 by the first silicon nanowire W1 and the silicon nanowire transistor by the second silicon nanowire W2.

Figure 12:
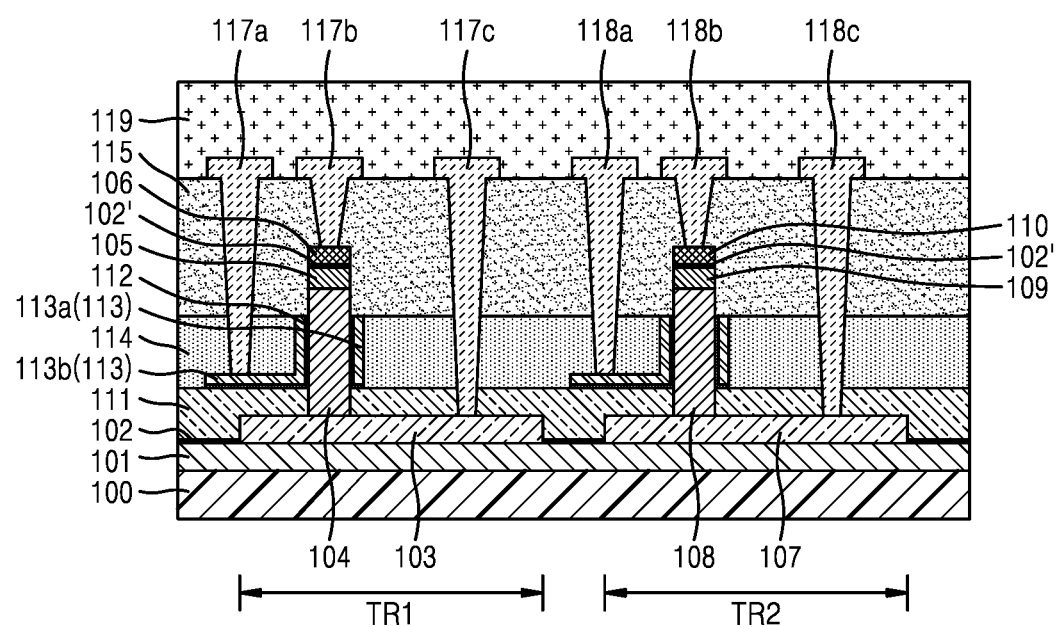
FIG. 12 shows a process for forming metal pads on the ILD layer over the substrate during manufacturing a vertical nanowire semiconductor device, according to an example embodiment.

As shown in FIG. 12, metal pads 117a, 117b, 117c, 118a, 118b, and 118c are formed on the ILD layer 115 to be electrically connected to the second silicon conductive layers 105 and 109 and the gate 113 of the first and second transistors TR1 and TR2 thereunder through the contact holes 115a, 115b, 115c, 116a, 116b, and 116c.

Following this process, an additional process may be performed according to the design of an electronic device to be applied.

Figure 13:
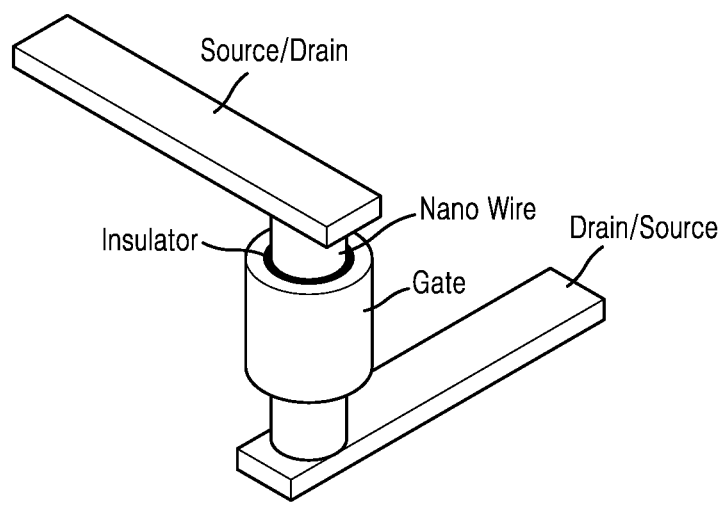
FIG. 13 is a view for explaining a basic structure of a vertical nanowire semiconductor device, according to an example embodiment.

As schematically shown in FIG. 13, a nanowire semiconductor device descried above through the above embodiment includes a single crystal grain silicon nanowire, which is a vertical channel between a source and a drain arranged in parallel above a substrate, and a gate surrounding the single crystal grain silicon nanowire. Here, the single crystal grain silicon nanowire has a crystal structure that is grown in (111) direction.

When the crystal growth of the single crystal grain silicon nanowire is achieved by MIC, and an amorphous layer formed of NiOx, NiCxOy, NiNxOy, NiCxNyOz, NiCxOy:H, NiNxOy:H, NiCxNyOz:H, NixSiy, NixGey, or the like may be applied as a crystallization catalyst layer. Such a catalyst layer may be deposited according to an ALD method. In the description of the above embodiment, a silicon semiconductor layer corresponding to a channel may be doped with n-type or p-type dopant and, according to another embodiment, may be formed of intrinsic silicon.

MIC heat treatment for crystallizing amorphous silicon may be performed in a normal heating furnace or may be performed in a heating furnace to which an electromagnetic field is applied. In the case of a vertical silicon nanowire providing a channel, $NiSi_2$ inducing crystallization rises to the topmost surface of a second silicon conductive layer, rises to the surface, and contacts a metal layer to function as a contact layer. A silicon nanowire described in an example embodiment may be applied not only to manufacture a transistor but also to manufacture a memory device, and a diode.

In the description of the above embodiment, one transistor includes one nanowire. However, according to another embodiment, one transistor may include a plurality of nanowires and thus have a multichannel structure.

Also, in a semiconductor device as described above, a first conductive layer and a second conductive layer may have different doping types, and thus, a tunneling field effect transistor having a structure of p+-i-n+ or n+-i-p+ may be manufactured.

In the above-described embodiment, silicon is applied as a semiconductor material, but SiGe, Ge, or the like may be applied as the semiconductor material in addition to silicon.

According to another embodiment of the present disclosure, on the basis of a method as described above, a silicon solar cell may be manufactured above a polycrystalline silicon substrate or a heterogeneous substrate, a 3D stack memory may be manufactured by manufacturing a 3D stack structure, and various types of devices may be integrated above one substrate.

A method of manufacturing a semiconductor device according to an embodiment of the present disclosure has been described to aid in understanding the present disclosure with reference to the embodiments shown in the drawings, but this is merely an example. It will be understood by one of ordinary skill in the art that various modifications and other equivalent embodiments are possible therefrom.

Therefore, the technical scope of the present disclosure should be defined by the appended claims.

The invention claimed is:

1. A vertical nanowire semiconductor device manufactured by a method of manufacturing a vertical nanowire semiconductor device, the method comprising:
    forming a buffer layer on a substrate;
    forming a seed layer of catalyst material containing Ni on the buffer layer;
    forming, on the seed layer, a multilayer in which a first conductive layer, a semiconductor layer, a second conductive layer, and a metal layer are sequentially stacked;
    forming a vertical nanowire including the semiconductor layer, the second conductive layer, and the metal layer above the substrate by patterning the multilayer;
    performing metal induced crystallization (MIC) through low temperature heat treatment and producing reactant of the seed layer for crystallization, activation, and formation of a contact layer,
    wherein crystal growth started in the first conductive layer in contact with the seed layer reaches the second conductive layer in the crystallization; and
    the activation of the first conductive layer and the second conductive layer is induced by the crystallization;
    forming the contact layer between the second conductive layer and the metal layer while the reactant reaches the second conductive layer;
    forming an insulating layer covering the vertical nanowire;
    forming a gate surrounding a channel area by the semiconductor layer of the vertical nanowire; and
    forming a metal pad electrically connected to the gate, the first conductive layer, and the second conductive layer;
    the vertical nanowire semiconductor device comprising:
    the substrate;
    the buffer layer formed on the substrate;
    the first conductive layer, non-dopant implanted, in a source or drain area formed on the buffer layer, wherein a crystal structure thereof is grown in <111> orientation;
    a single crystal grain semiconductor nanowire of the channel area vertically upright with respect to the substrate on the buffer layer, wherein a crystal structure thereof is grown in <111> orientation of a single crystal grain;
    the second conductive layer of a drain or source area, non-implanted and directly formed on a top of the single crystal grain semiconductor nanowire, wherein a crystal structure thereof is grown in <111> orientation;
    a non-dopant implanted $NiSi_2$ contact layer directly formed on a top of the second conductive layer;
    the metal layer directly formed on a top of the $NiSi_2$ contact layer;
    the gate surrounding the channel area of the vertical nanowire and being tubular shaped; and
    a tubular shaped gate insulating layer located between the channel area and the tubular shaped gate.

2. The vertical nanowire semiconductor device of claim 1, wherein the first conductive layer, the second conductive layer, and the semiconductor nanowire include one of Si, SiGe, and Ge.

3. The vertical nanowire semiconductor device of claim 1, wherein the semiconductor nanowire includes a first nanowire for a PMOS semiconductor device and a second nanowire for an NMOS semiconductor device.

4. The vertical nanowire semiconductor device of claim 2, wherein the semiconductor nanowire includes a first nanowire for a PMOS semiconductor device and a second nanowire for an NMOS semiconductor device.

5. The vertical nanowire semiconductor device of claim 3, wherein each of the PMOS semiconductor device and the NMOS semiconductor device has a multichannel structure having a plurality of nanowires.

6. The vertical nanowire semiconductor device of claim 4, wherein each of the PMOS semiconductor device and the NMOS semiconductor device has a multichannel structure having a plurality of nanowires.

* * * * *